United States Patent
Watkins

(10) Patent No.: US 10,547,279 B2
(45) Date of Patent: Jan. 28, 2020

(54) SWITCHED AMPLIFIER

(71) Applicant: Kabushiki Kaisha Toshiba, Minato-ku (JP)

(72) Inventor: Gavin Watkins, Bristol (GB)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/816,278

(22) Filed: Nov. 17, 2017

(65) Prior Publication Data
US 2019/0158047 A1    May 23, 2019

(51) Int. Cl.
*H03F 3/217*    (2006.01)
*H03F 3/72*    (2006.01)
(Continued)

(52) U.S. Cl.
CPC .............. *H03F 3/72* (2013.01); *H03F 1/0288* (2013.01); *H03F 1/56* (2013.01); *H03F 3/193* (2013.01);
(Continued)

(58) Field of Classification Search
CPC . H03F 3/72; H03F 1/0288; H03F 1/56; H03F 3/193; H03F 3/2176; H03F 3/217;
(Continued)

(56) References Cited

U.S. PATENT DOCUMENTS 5,541,554 A * 7/1996 Stengel ................. H03F 1/0277
330/295
5,903,854 A   5/1999 Abe et al.
(Continued)

FOREIGN PATENT DOCUMENTS

JP   3-104408   5/1991
JP   8-307159   11/1996
(Continued)

OTHER PUBLICATIONS

Tongqiang Gao, et al. "A CMOS class-E Power Amplifiers with Power Control", IEEE Journal, 2007, pp. 4.
(Continued)

*Primary Examiner* — Khanh V Nguyen
(74) *Attorney, Agent, or Firm* — Oblon, McClelland, Maier & Neustadt, L.L.P.

(57) ABSTRACT

An amplifier for amplifying radio frequency signals comprising: a signal splitter configured to split an input radio frequency signal into two or more signals; and two or more switching power amplifiers. Each of the switching power amplifiers is configured to amplify a respective signal of the two or more signals using an active device and output a respective amplified signal at a respective output terminal of the switching power amplifier when the switching power amplifier is activated. Each of the two or more switching power amplifiers has a different maximum output power. The amplifier further comprises: an output node connected to each of the output terminals of the switching power amplifiers to combine the amplified signals and output a combined amplified signal; and control circuitry configured to issue control signal to control bias voltages provided to a gate of each of the active devices of the switching power amplifier to selectively activate and deactivate the active devices.

13 Claims, 10 Drawing Sheets

(51) Int. Cl.
*H03F 1/02* (2006.01)
*H03F 1/56* (2006.01)
*H03F 3/193* (2006.01)

(52) U.S. Cl.
CPC ........... *H03F 3/2176* (2013.01); *H03F 3/217* (2013.01); *H03F 3/2173* (2013.01); *H03F 2200/171* (2013.01); *H03F 2200/18* (2013.01); *H03F 2200/204* (2013.01); *H03F 2200/222* (2013.01); *H03F 2200/331* (2013.01); *H03F 2200/387* (2013.01); *H03F 2200/391* (2013.01); *H03F 2200/451* (2013.01); *H03F 2200/541* (2013.01); *H03F 2203/7215* (2013.01); *H03F 2203/7221* (2013.01); *H03F 2203/7236* (2013.01)

(58) Field of Classification Search
CPC .................. H03F 3/2171; H03F 3/2173; H03F 2200/432; H03F 1/04; H03F 1/34; H03F 2200/351; H03F 200/432; H03F 2200/78; H03F 2200/391; H03F 2200/222; H03F 2203/7215; H03F 2200/451; H03F 2200/331; H03F 2200/541; H03F 2203/7221; H03F 2203/7236; H03F 2200/387; H03F 2200/204; H03F 2200/18
USPC .............................................. 330/207 A, 251
See application file for complete search history.

(56) References Cited

U.S. PATENT DOCUMENTS

| | | | | |
|---|---|---|---|---|
| 6,114,911 A * | 9/2000 | Iwai | ........................ | H03F 3/602 330/295 |
| 7,408,405 B2 * | 8/2008 | Ohnishi | ................ | H03F 1/0277 330/302 |
| 7,518,448 B1 * | 4/2009 | Blair | ..................... | H03F 1/0261 330/124 R |
| 7,728,662 B2 * | 6/2010 | Apel | ..................... | H03F 1/0244 330/124 D |
| 7,876,159 B2 * | 1/2011 | Wang | .................... | H03F 1/0288 330/124 R |
| 9,461,594 B2 * | 10/2016 | Tabei | .................... | H03F 1/0266 |
| 2012/0034956 A1 * | 2/2012 | Green | .................. | H03F 1/0261 455/571 |
| 2014/0368274 A1 | 12/2014 | Kimura | | |
| 2015/0048899 A1 | 2/2015 | Van Der Heijden | | |
| 2015/0137885 A1 | 5/2015 | Kingsley | | |
| 2015/0255219 A1 | 9/2015 | Schenk | | |
| 2016/0226450 A1 | 8/2016 | Ma et al. | | |
| 2016/0248379 A1 * | 8/2016 | Lehtola | .................... | H03F 3/19 |
| 2017/0104456 A1 | 4/2017 | Motoi et al. | | |

FOREIGN PATENT DOCUMENTS

| | | |
|---|---|---|
| JP | 2002-374128 | 12/2002 |
| JP | 2012-114711 | 6/2012 |
| JP | 2012-235382 | 11/2012 |
| TW | 201630330 A | 8/2016 |

OTHER PUBLICATIONS

Alireza Shirvani, et al. "A CMOS RF Power Amplifier with Parallel Amplification for Efficient Power Control", IEEE Journal of Solid-State Circuits, vol. 37, No. 6, Jun. 2002, pp. 10.

K. Motoi, et al. "Digital Doherty Transmitter with Envelope ΔΣ Modulated Class-D GaN Power Amplifier for 800 MHz band", IEEE Conference, NEC, 2014, pp. 4.

Gavin T. Watkins, et al. "Interaction of the Human Body on the Performance of Class E PAs in Body Area Networks", IEEE, 2013, pp. 4.

Nathan O. Sokal, et al. "Class E-A New Class of High-Efficiency Tuned Single-Ended Switching Power Amplifiers," IEEE Journal of Solid-State Circuits, vol. SC-10, No. 3, Jun. 1975, pp. 9.

Ramon A. Beltran et al. "Simplified Analysis and Design of Outphasing Transmitters Using Class-E Power Amplifiers", IEEE, 2015, pp. 3.

Office Action dated May 14, 2019 in Japanese Application No. 2018-024470.

\* cited by examiner

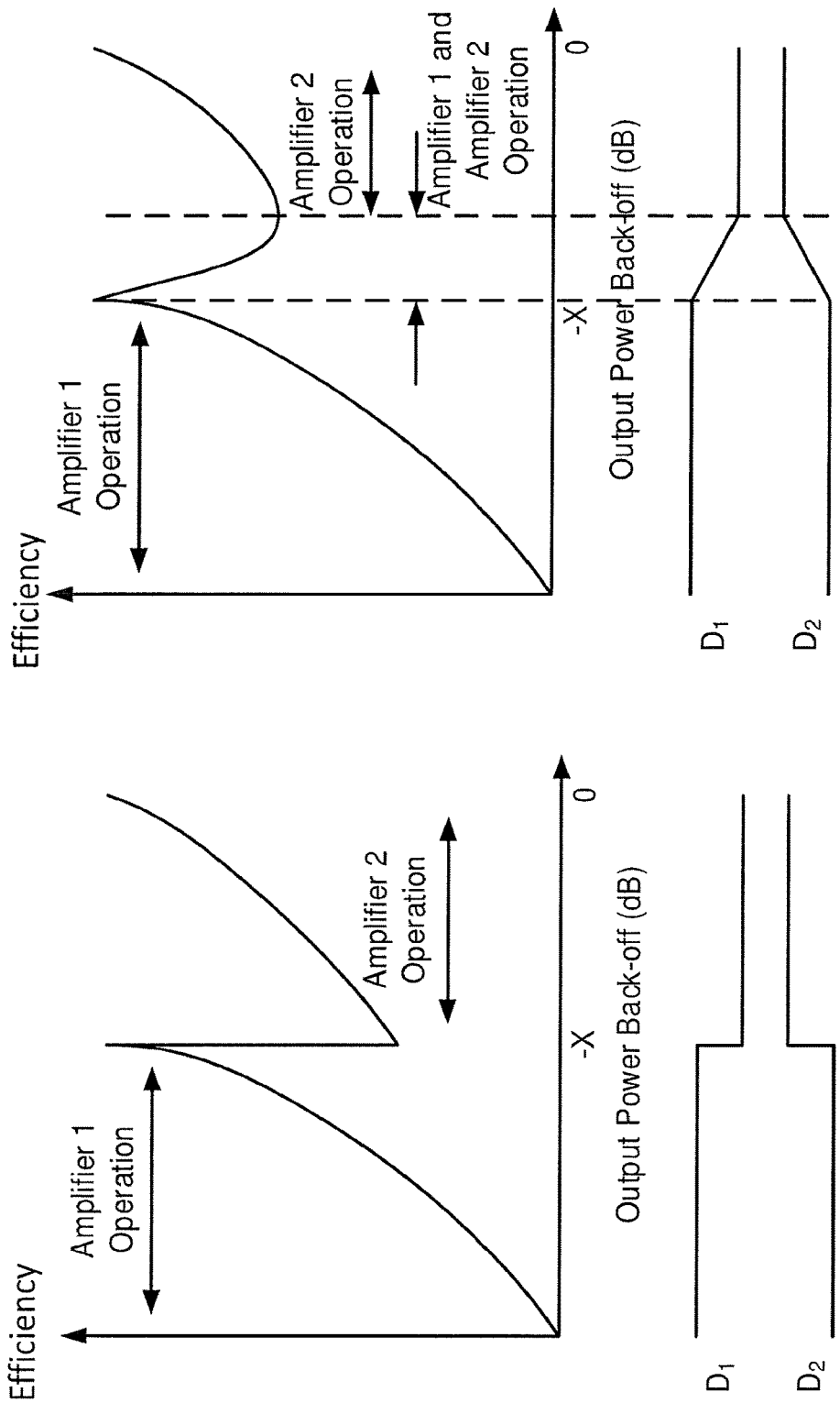

US 10,547,279 B2

SWITCHED AMPLIFIER

TECHNICAL FIELD

The present disclosure relates to amplifiers for amplifying radio frequency signals. In particular, but without limitation, this disclosure relates to amplifiers for amplifying radio frequency signals that have a large peak to average power ratio (PAPR).

BACKGROUND

Radio frequency (RF) power amplifiers are utilized in RF communication systems to increase the power of an input RF signal to allow the signal to be transmitted over a transmission channel (e.g. through an antenna). The gain response and efficiency of a given power amplifier depends on its design. Many power amplifiers fall within certain classes (i.e. classes A, B, C, E, F and J) that specify the general characteristics of the amplifiers.

Many communications, broadcast and wireless standards like Long-Term Evolution (LTE), Digital Video Broadcasting (DVB), Integrated Services Digital Broadcasting (ISDB) and 802.11ax are based on orthogonal frequency division multiplexing (OFDM) modulation. In addition, the Advanced Televisions Systems Committee (ATSC) are planning to introduce OFDM in future standards. Although OFDM is very spectrally efficient, it does so at the expense of a high peak-to-average power ratio (PAPR).

Single device radio frequency power amplifiers are capable of achieving high efficiency only at their peak output power ($P_{OUT}$), which is significantly degraded as $P_{OUT}$ is reduced. To avoid reaching the peak output power and thereby hitting saturation point, communications, broadcast and wireless connectivity signals generally require that on average the power amplifier operates significantly below the peak output power, while still being able to accommodate the large signal peaks. Operating an amplifier at an average power below the maximum power is referred to as "backing-off".

Backing-off in light of a high PAPR therefore leads to a low average efficiency for a single device radio frequency power amplifier. There is therefore a need for a radio frequency power amplifier with improved efficiency for systems with a high PAPR.

BRIEF DESCRIPTION OF THE DRAWINGS

Arrangements of the present invention will be understood and appreciated more fully from the following detailed description, made by way of example only and taken in conjunction with drawings in which:

FIG. 10 shows how the efficiency of the amplification system of FIG. 7 varies as the output power is backed-off from the peak output power;
FIG. 11 shows how the efficiency varies in an arrangement with gradual switching.

DETAILED DESCRIPTION

Figure 1:
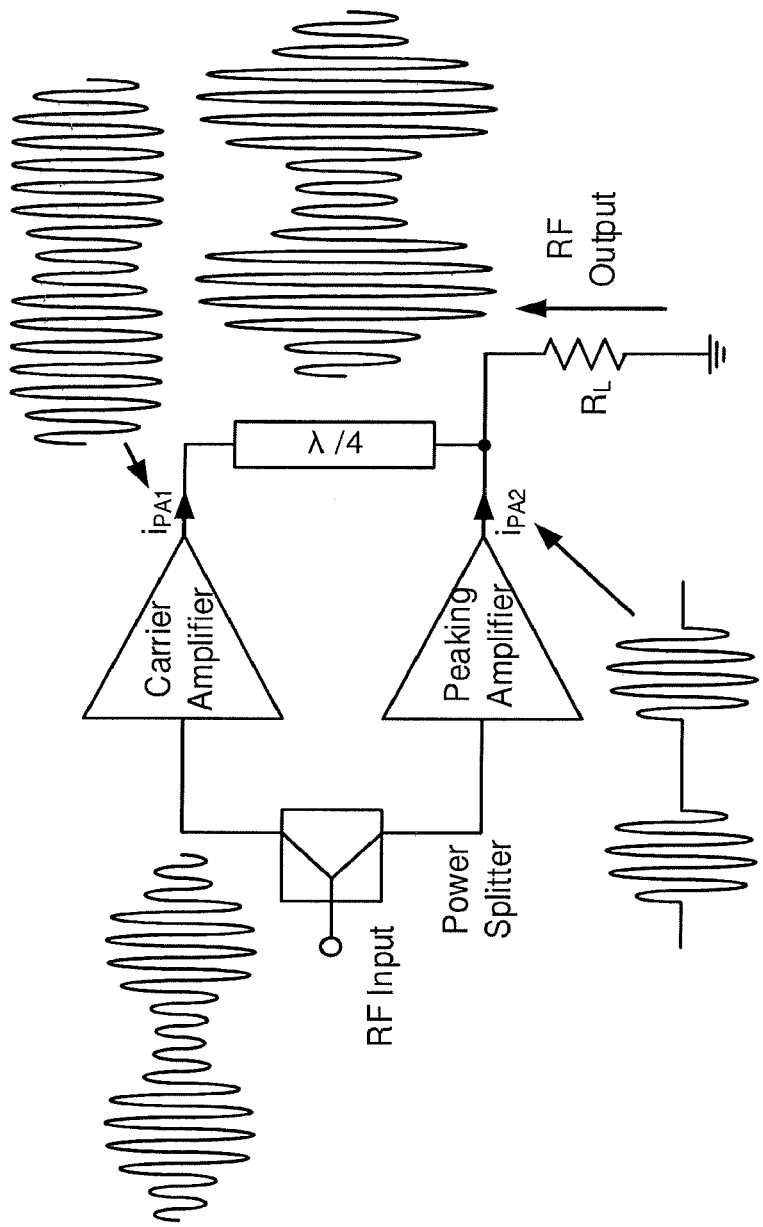
FIG. 1 shows an example of a Doherty power amplifier.

According to a first aspect there is provided an amplifier for amplifying radio frequency signals. The amplifier comprises: an input node for receiving an input radio frequency signal to be amplified; a signal splitter connected to the input node and configured to split the input radio frequency signal into two or more signals; and two or more switching power amplifiers corresponding to the two or more signals. Each of the switching power amplifiers is configured to amplify a respective signal of the two or more signals using an active device and output a respective amplified signal at a respective output terminal of the switching power amplifier when the switching power amplifier is activated. Each of the two or more switching power amplifiers has a different maximum output power. The amplifier further comprises: an output node connected to each of the output terminals of the switching power amplifiers to combine the amplified signals and output a combined amplified signal; and control circuitry configured to issue two or more control signals to the two or more switching power amplifiers. Each control signal controls a bias voltage provided to a gate of the active device of the respective switching power amplifier to selectively activate and deactivate the active device.

By utilising multiple switching power amplifiers with different maximum output powers and selectively activating and the deactivating the switching power amplifiers via bias voltages applied to the gates of the active devices of the switching power amplifiers, the arrangements described herein provide a simpler and more efficient amplification system for amplifying radio frequency signals. Furthermore, controlling the power amplifiers at their gates also allows for gradual switching between power amplifiers, as the biasing voltages can be gradually increased and decreased, improving linearity relative to hard on/off switching that may be provided by alternative systems.

The outputs of the switching power amplifiers are combined at the output node to provide a combined amplifier signal. This combination may be in the form of a combination over time, in that, only one switching power amplifier may be activated at one time, therefore the combined signal is a combination of the different outputs from the different switching power amplifiers as they are activated and deactivated over time. Alternatively, there may be some period during which multiple switching power amplifiers are activated, and the combined amplified signal is the addition of multiple amplified signals.

In one arrangement, the switching power amplifiers are purely reactive circuits. This means that the switching power amplifiers need not be isolated from each other, as they do not place a large load on the system, even when deactivated. This helps reduce the complexity of the system by avoiding the need for any combining circuitry (beyond the output node). Accordingly, in one arrangement, the output terminals of each switching power amplifier are connected directly to each other without any reactive matching networks, switches or transmission lines.

The control signals may be converted into respective bias voltages by respective biasing circuitry to bring the controls signals into the correct range of voltages for switching the gates of the active devices. Alternatively, the control signals may be the bias voltages themselves and therefore may be able to be applied directly to the gates of the active devices.

According to an arrangement the amplifier is configured to, for each switching power amplifier, combine the respective bias voltage with the respective signal to form a respective combined bias voltage and apply the respective combined bias voltage to the gate of the respective active device to amplify the respective signal. Accordingly, for each switching power amplifier the bias voltage turns the gate on and off and the signal controls the gate to amplify the signal.

According to a further arrangement the two or more switching power amplifiers are class E power amplifiers. Class E power amplifiers are more efficient than alternative switching power amplifiers (e.g. class F power amplifiers). In addition, class E power amplifiers include band-pass filters (or low pass filters) to filter out higher level harmonics and therefore avoid the need for quarter wavelength transformers (as in class F) which can take up a large amount of space. Accordingly, class E power amplifiers have a smaller form factor.

According to an arrangement the maximum output power of a first amplifier of the switching power amplifiers is lower than the maximum output power of a second amplifier of the switching power amplifiers; and the control circuitry is configured to activate the first switching power amplifier when the input signal has an amplitude that falls within a first region and to activate the second switching power amplifier when the amplitude of the input radio frequency signal falls within a second region, the second region being higher than the first region. The amplitude of the input radio frequency signal may be the amplitude of the voltage of the signal or the amplitude of the instantaneous power.

Where the input radio frequency signal is envelope modulated, the amplitude could be the envelope voltage. The first region may cover a lower region of input RF signal's dynamic range and the second region may cover an upper region of input RF signal's dynamic range. The two switching power amplifiers have different maximum output powers and therefore different power ratings. This could be achieved via different power amplifier configurations, different supply voltages for the respective active devices and/or (for class E) different quality factors for output filters for the switching power amplifiers In a further arrangement the maximum output power of the first switching power amplifier is substantially equal to an average power of the input radio frequency signal. The maximum output power of the second switching power amplifier could be substantially equal to the expected maximum output power for the amplifier. The maximum output powers need not be set to exactly these values, and could be tuned by a few dB to achieve the best performance. The average power may be the average power across the whole wavelength of an envelope function of an envelope modulated input signal. Accordingly, the first switching power amplifier may be optimised for the average output power, second switching power amplifier may be optimised for the peak output power.

In a further arrangement, the control circuitry is configured to activate the second switching power amplifier when the amplitude of the input radio frequency signal passes above a first threshold and to activate the first switching power amplifier when the amplitude of the input radio frequency signal passes below a second threshold.

In one arrangement the first and second thresholds are the same. This provides even switching with no hysteresis. This may be implemented simply using a single threshold, above which the second amplifier is activated, and below which the first amplifier is activated. This provides improved efficiency.

In an alternative arrangement the second threshold is lower than the first threshold. This provides hysteresis to the switching, improving the linearity.

Further options for improving linearity include the use of digital pre distortion techniques (or other linearization techniques). A linearizer could be applied to the input radio frequency signal and/or the control signals to improve signal fidelity. This may corrects for any non-linear response of amplifier by applying a modulation that is the inverse of the distortion introduced by the amplifier.

In a further arrangement the control circuitry is configured to deactivate the first switching power amplifier when the amplitude of the input radio frequency signal passes above the first threshold and to deactivate the second switching power amplifier when the power of the input radio frequency signal passes below the second threshold. This provides clear switching between the two switching power amplifiers devices, improving efficiency.

In an alternative arrangement the control circuitry is configured to gradually transition between switching power amplifiers when switching between switching power amplifiers. This improves linearity at the expense of efficiency. This may be achieved by gradually reducing the previously high bias voltage and gradually increasing the previously low bias voltage over switching region of input amplitude voltages. Switching between switching power amplifiers may comprise gradually deactivating one switching power amplifier and gradually activating another switching power amplifier.

In one arrangement, gradually transitioning between switching power amplifiers comprises, when switching between from the first switching power amplifier to the second switching power amplifier: gradually changing the bias voltage for the first switching power amplifier from a respective activation bias level to a respective deactivation bias level over a range of amplitudes for the input radio frequency signal; and gradually changing the bias voltage for the second switching power amplifier from a respective deactivation bias level to a respective activation bias level over the range of amplitudes for the input radio frequency signal.

The activation bias level may be a bias level sufficient to turn the respective switching power amplifier fully on. The deactivation bias level may be sufficient to turn the respective switching power amplifier fully off. The activation and deactivation bias levels need not be the same for each switching power amplifier.

In one arrangement gradually transitioning between switching power amplifiers comprises, when switching between from the second switching power amplifier to the first switching power amplifier: gradually changing the bias voltage for the second switching power amplifier from a respective activation bias level to a respective deactivation bias level over a range of amplitudes for the input radio frequency signal; and gradually changing the bias voltage for the first switching power amplifier from a respective deactivation bias level to a respective activation bias level over the range of amplitudes for the input radio frequency signal.

In one arrangement gradually transitioning between switching power amplifiers comprises changing the respective bias voltages for the respective switching power amplifiers based on respective predefined changes per unit change in the amplitude of the input radio frequency signal.

According to a further arrangement there is provided a communication device comprising: an amplifier as described above; a processor configured to generate the input radio frequency signal and provide the input radio frequency signal to the amplifier; and an antenna configured to receive the combined amplified signal from the amplifier and transmit the combined amplified signal.

The arrangements described herein provide improved efficiency for amplifying RF signals with high PAPR in a system of reduced complexity and size.

Peak efficiency for power amplifiers is achieved at their maximum output power ($P_{OUT}$). The efficiency of power amplifiers drops significantly as $P_{OUT}$ is reduced below the maximum $P_{OUT}$. This can significantly impact efficiency when amplifying signals with a high PAPR.

To mitigate the drop in efficiency as output power drops, multiple power amplifiers may be used in parallel. The different power amplifiers may have different maximum output powers. By using multiple power amplifiers in parallel the power efficiency of the overall system may be improved across a wider range of $P_{OUT}$ (a large PAPR).

Examples of methods implementing multiple power amplifiers to improve the amplifier efficiency when amplifying signals with a large PAPR include Doherty amplifiers, envelope tracking (ET), dynamic load modulation (DLM) and outphasing. These are all capable of high performance, but this generally comes at a high degree of complexity. This can increase the size and cost of the amplifier, both of which are important characteristics, particularly in the field of mobile communications.

There is therefore a need for a new power amplifier with improved efficiency for high PAPR signals that is implemented in a reduced complexity design.

FIG. 1 shows an example of a Doherty power amplifier. The Doherty power amplifier includes two power amplifiers connected to each other in parallel. The first power amplifier is a carrier amplifier. The carrier amplifier can operate over the entirety of the input signal (e.g. the carrier amplifier might be a class AB amplifier). The second power amplifier is a peaking amplifier. The peaking amplifier only operates over the upper half of the modulated signal amplitude (e.g. the peaking amplifier might be a class C amplifier). The peaking amplifier is ON when the input power is high and OFF when the input power is low.

A radio frequency input is received at an input terminal connected to a quadrature coupler. The quadrature coupler is a power splitter that divides the input signal into two signals that are out of phase from each other by 90°. The first output of the power splitter is connected to the carrier amplifier. A second output of the power splitter is connected to the peaking amplifier.

The outputs of the two amplifiers are connected together via a quarter wavelength ($\lambda/4$) transformer. In this case, the output line of the carrier amplifier is connected to the quarter wavelength transformer which is connected to the output line of the peaking amplifier. The quarter wavelength transformer brings the two output signals back into phase with one another. This means that the outputs combine together to form an amplified signal (RF Output).

As the peaking amplifier and the carrier amplifier are not isolated from each other, the presence of the peaking amplifier changes the impedance presented to the output of the carrier amplifier. This is called load modulation.

Figure 2:
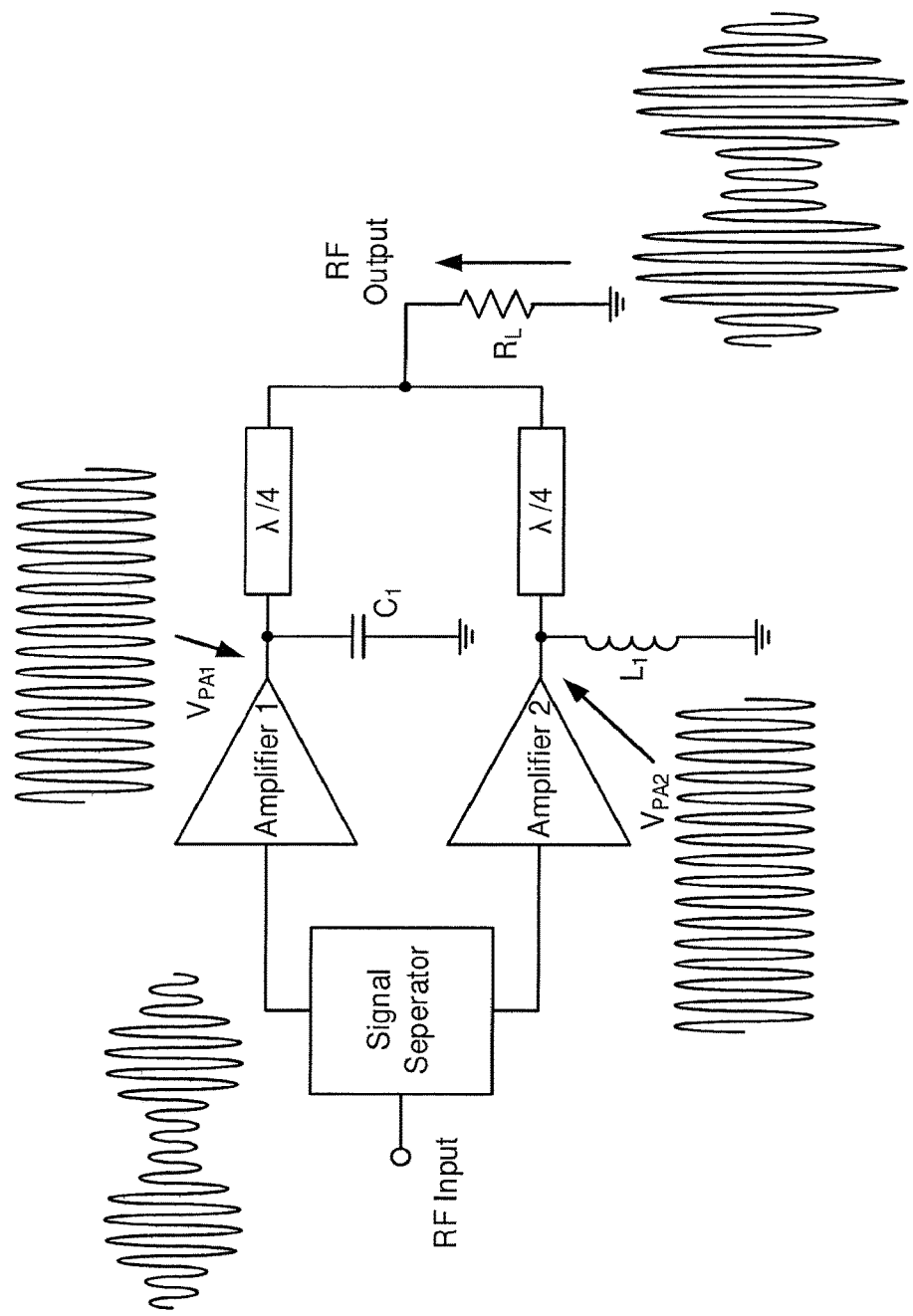
FIG. 2 shows an example of an outphasing amplifier.

FIG. 2 shows an example of an outphasing amplifier. As with the Doherty amplifier, the outphasing amplifier comprises two amplifiers connected in parallel. In this case, both amplifiers operate across the whole of the signal.

A signal separator splits an input RF signal between the two power amplifiers. The signal separator splits the input signal into two phase and amplitude modulated signals, each driving a respective power amplifier.

The outputs of each amplifier are combined at a combining point. The output line of each amplifier is connected to the combining point via a respective quarter wavelength transformer ($\lambda/4$).

A capacitor with capacitance $C_1$ is connected between the output line of the first amplifier and ground. An inductor with inductance $L_1$ is connected between the output line of the second amplifier and ground. The magnitude of inductance $L_1$ is equal to the magnitude of capacitance $C_1$ ($L_1 = -C_1$). This provides shunt compensation which increases the efficiency at back-off.

Figure 3:
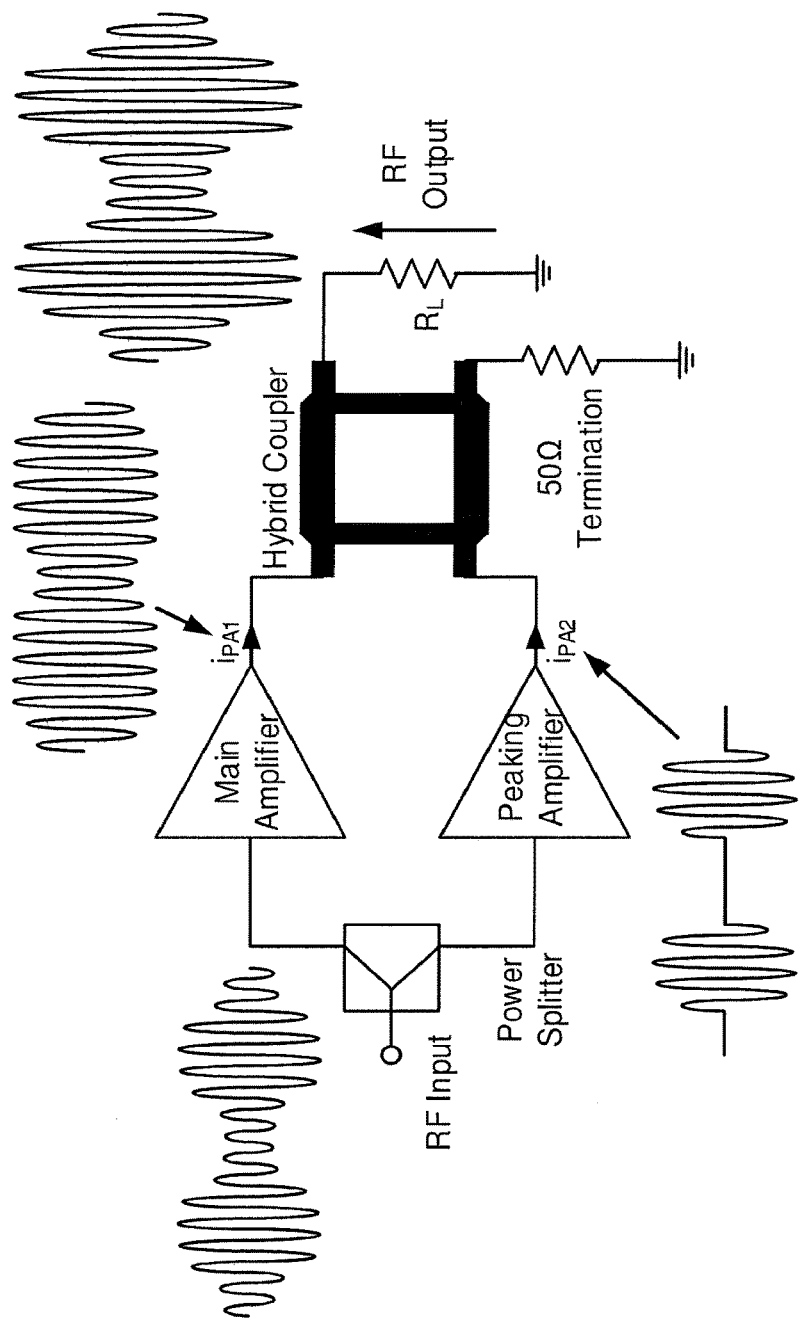
FIG. 3 shows an example of a sequential power amplifier.

FIG. 3 shows an example of a sequential power amplifier. The sequential power amplifier is similar to the Doherty amplifier in that it utilises a main amplifier that is always ON and a peaking amplifier that is only ON when the input signal is high.

In contrast to the Doherty amplifier, the outputs of the two amplifiers are combined using a hybrid coupler. Furthermore, the splitter does not apply any load modulation.

Figure 4:
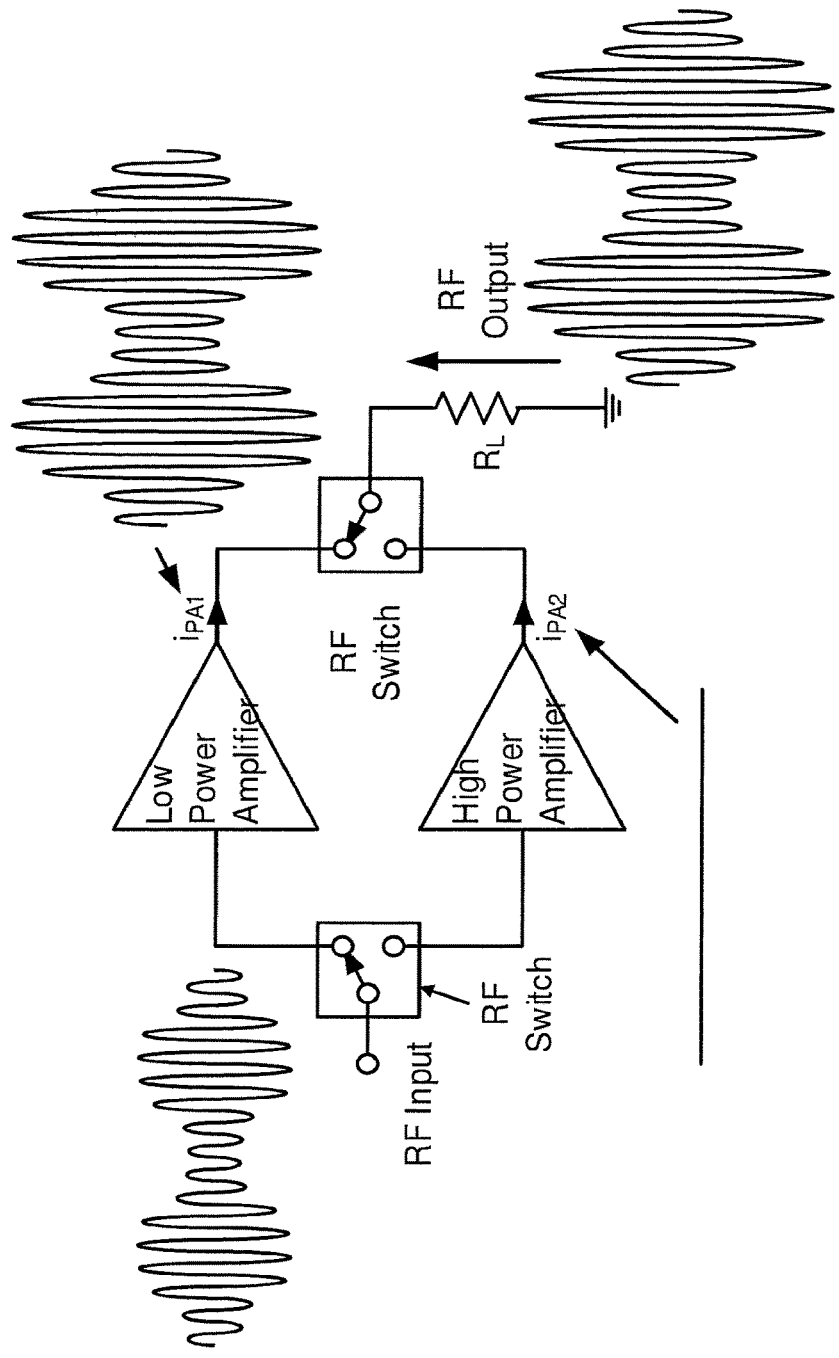
FIG. 4 shows a power control switched power amplifier.

FIG. 4 shows a power control switched power amplifier. The amplifier comprises a low power amplifier and a high power amplifier. The low power amplifier is configured to operate effectively for low power input signals. The high power amplifier is configured to operate effectively for high power input signals.

A three way switch allows the input to be switched between the low power amplifier and the high power amplifier depending on the input power. This ensures that the most efficient amplifier is being utilised depending on the peak input power.

A corresponding three way switch is used to connect the output of the currently selected power amplifier to an output line.

Figure 5:
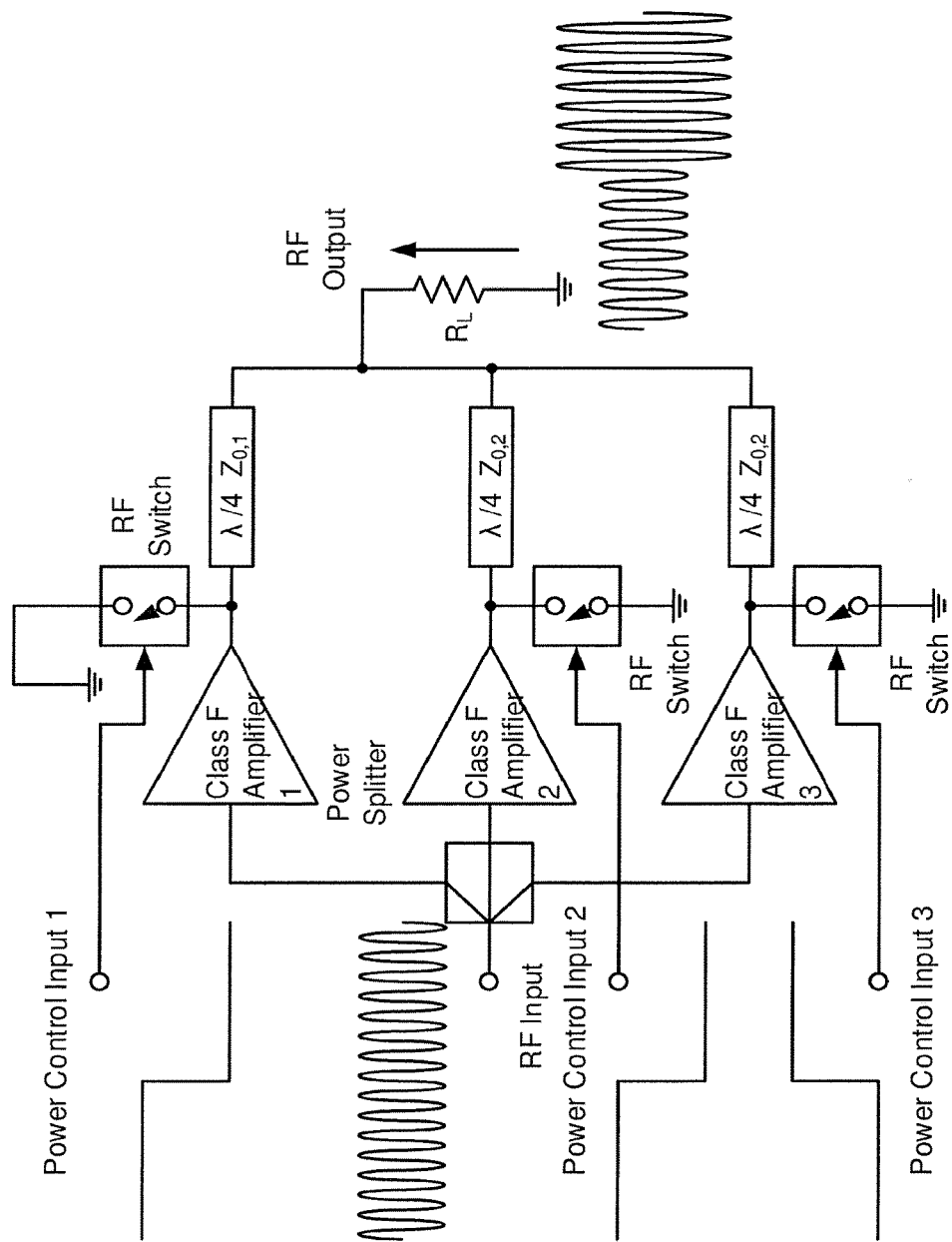
FIG. 5 shows an example of a digitally control power control switching amplifier.

FIG. 5 shows an example of a digitally controlled switching power amplifier. In this case, three class F switching amplifiers are used.

This system operates with an RF input that has a constant envelope (the amplitude of the RF input does not change). The RF input is split at a three way splitter to provide inputs for the three switching amplifiers.

The switching amplifiers are configured for different peak output powers. Accordingly, the amount of amplification can be selected by digitally selecting which combination of power amplifiers are activated.

The output lines of each switching amplifier are connected to respective quarter wavelength transformer. The outputs of these quarter wavelength transformers are connected together to combine the outputs of the two branches. The output signal is output over a resistor $R_L$.

To control which switching amplifiers are turned on, a three switching signals (Power Control Inputs 1, 2 and 3) are provided. These switching signals turn the respective branches of the amplifier on and off.

The output line for each switching amplifier is connected to a respective radio frequency switch. The RF switches are controlled by the switching signal for the respective branch. The switching signals selectively couple the output line to ground to switch the branch off. This produces a low impedance that is converted to a high impedance at the quarter wavelength transformer.

The RF switches are necessary as the signals from the desired switching amplifier may pass back through the circuit into the output of the undesired switching amplifiers. As these signals would pass through the quarter wavelength transformer, this process would provide a load that would degrade the efficiency of the desired amplifier. By shorting the deactivated branch to ground, a high impedance is set up across the quarter wavelength transformer on the undesired branch, isolating the branches to prevent signals from passing back through the undesired branch. Nevertheless, the inclusion of the RF switches and quarter wavelength transformers increases the overall complexity and size of the amplifier. Moreover, power is lost in the system as each amplifier is constantly on, even if the branch has been turned off by shorting the output to ground.

Figure 6:
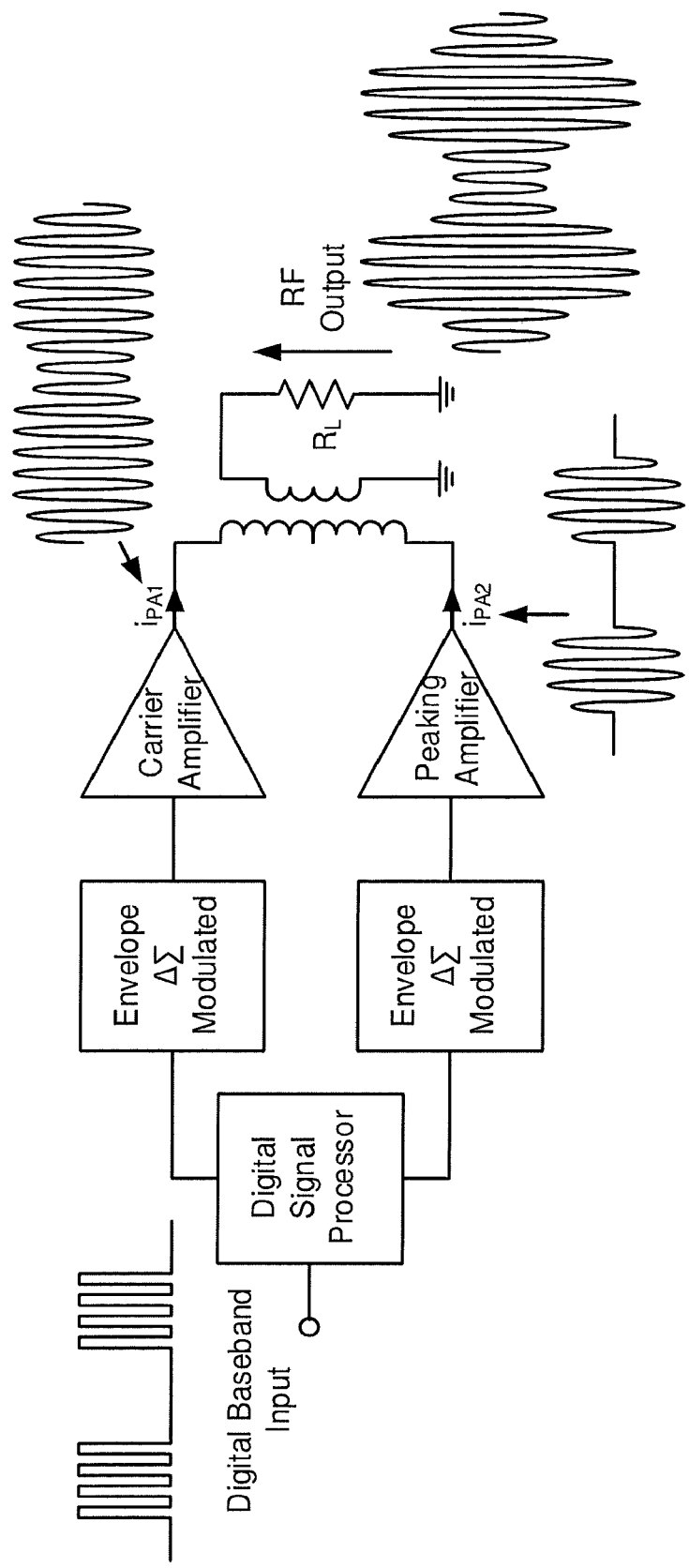
FIG. 6 shows an example of a digital Doherty power amplifier.

FIG. 6 shows an example of a digital Doherty power amplifier. As with the Doherty power amplifier, the digital Doherty power amplifier comprises a carrier amplifier and a peaking amplifier. In this case, the digital Doherty power amplifier is able to amplify a digital input signal.

A digital baseband input is provided to a digital signal processor. The digital signal processor splits the signal into two signals, each of which are provided to a respective branch of the amplifier. On each branch, the respective signal is modulated using an envelope delta-sigma modulator. The modulated signal is provided to the respective power amplifier (the carrier amplifier or the peaking amplifier, depending on the branch). The outputs of the two amplifiers are then combined at a quarter wavelength transformer that is connected between the output lines of the two amplifiers.

The examples of FIGS. 1-6 all require additional circuitry to the power amplifiers, such as load modulation, or an output combiner to effectively combine the signals from the various branches. This increases the size and complexity of the circuits.

The arrangements described herein include a multiple amplifier architecture to improve efficiency when amplifying RF signals with a high PAPR; however, avoid the need for any load modulation or any circuitry to combine the output signals of the two amplifiers. The arrangements therefore provide a more compact and less complicated amplification system.

Figure 7:
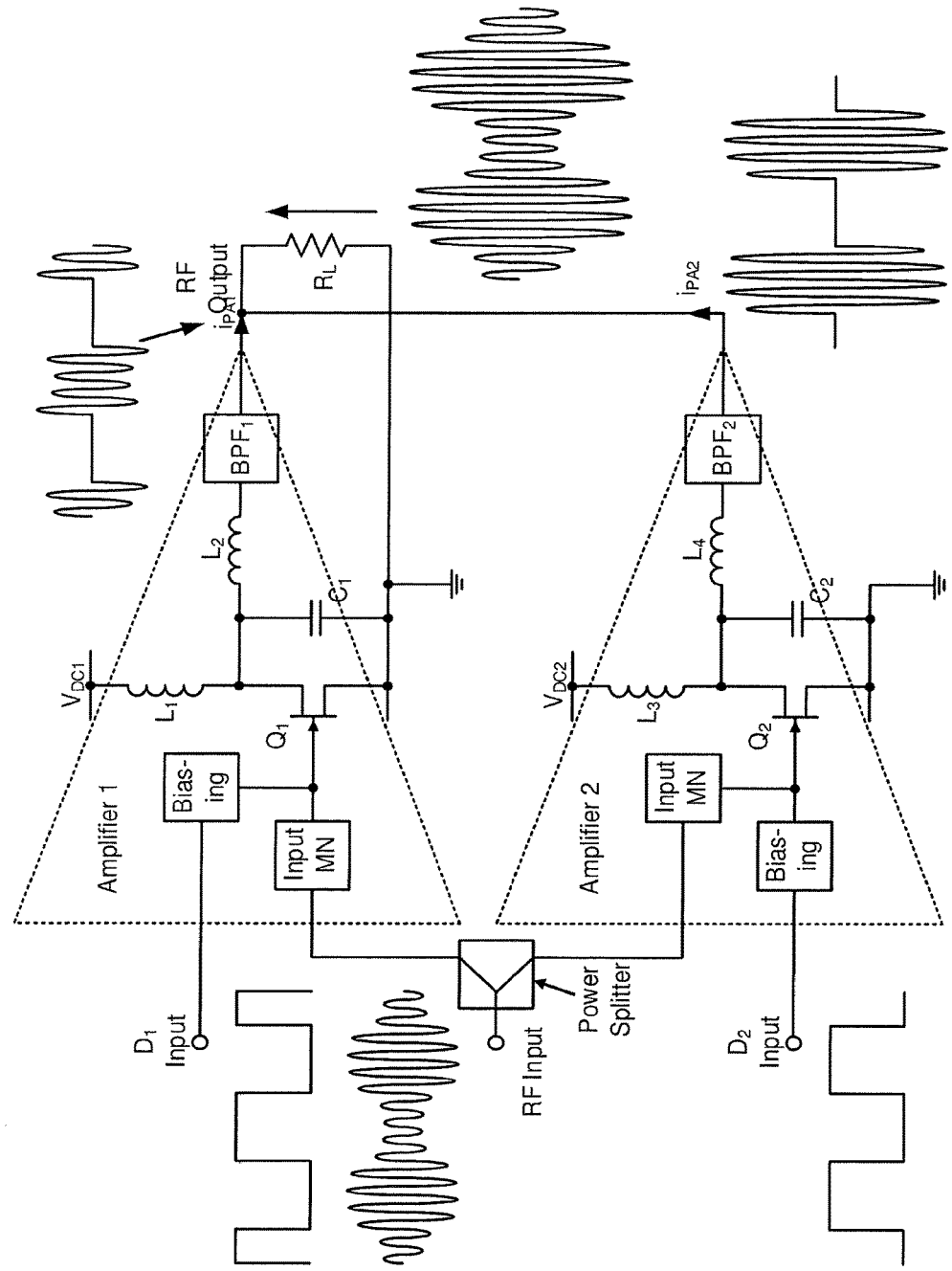
FIG. 7 shows an amplification system according to an arrangement.

FIG. 7 shows an amplification system according to an arrangement. Two switching amplifiers are used, Amplifier 1 and Amplifier 2. In the present arrangement, the two amplifiers are class E amplifiers, although other classes of amplifiers may be implemented. Similarly, the number of amplifiers could be increased from the two in this arrangement to three or more.

An RF input is applied to a power splitter, although other types of signal splitting network may be used. The power splitter simultaneously drives the inputs to both amplifiers. Amplifier 1 consists of an active device $Q_1$. In this example the active device is a Field Effect Transistor (FET) device; however, a bipolar transistor or other form of active device may be used instead.

The active device $Q_1$ has a gate that is driven by the RF signal through an input matching network (Input MN) and a biasing network.

The input matching network is connected between the respective output from the power splitter and the gate of the active device. The input matching network is for impedance matching of the input signal.

The biasing network is connected to the gate, in parallel to the input matching network. The other side of the biasing network is connected to a node that receives a first input signal $D_1$. The input signal $D_1$ is a switching signal that turns Amplifier 1 on when the signal is high and turns Amplifier 1 off when the signal is low. The biasing network is configured to convert an input digital signal ($D_1$) into a signal of appropriate voltage for switching the active device on and off.

In the present arrangement, the active devices of the two amplifiers both have a threshold voltage of 0.3V. Having said this, in alternative arrangements, alternative active devices with different threshold voltages may be utilised. In addition, it is not necessary for the active devices to have the same threshold voltage. The threshold voltages will vary depending on the device technology and its physical size.

A first DC signal $V_{DC1}$ is supplied to a first inductor $L_1$, which in turn is connected to the drain of the active device. The first inductor is a high value inductor, or RF choke, which has high impedance at the RF operating frequency. The source of the active device is connected to ground.

In the present case, an N-channel FET is used. Accordingly, when a low voltage is applied to the gate, the conductivity of the FET drops thereby increasing the voltage at the drain. Conversely, when a high voltage is applied to the gate, the conductivity of the FET increases, lowering the drain voltage towards ground. The active device therefore amplifies the input signal by controlling the proportion of the supply voltage that is output at the source.

The drain is also connected to a second inductor $L_2$ and a capacitor $C_1$. The capacitor $C_1$ is connected to ground, parallel to the active device and the second inductor $L_2$. The combination of $C_1$ and $L_2$ results in waveform shaping that causes Amplifier 1 to act as a class E amplifier. In some arrangements, the first capacitor $C_1$ is not required, and the capacitance $C_1$ is instead fulfilled by the drain-source capacitance $C_{ds}$ of the active device $Q_1$.

The far side of the second inductor $L_2$ is connected to a band-pass filter ($BPF_1$). This ensures that any harmonics generated by the active device are reflected back towards the active device instead of reaching the output of Amplifier 1.

Amplifier 2 is arranged in an identical manner, with a respective input signal $D_2$, biasing network, input matching network, gate $Q_2$, first inductor $L_3$, second inductor $L_4$, capacitor $C_2$ and band pass filter $BPF_2$. Having said this, the two amplifiers are configured to have different peak output powers, as shall be discussed below.

The outputs of Amplifier 1 and Amplifier 2 are directly connected together at an output node to form a combined output signal. The direct connection means that no additional components are located between the output terminals of the two amplifiers. The combined output signal can then be output (e.g. to an antenna). In the present arrangement, the antenna is represented by resistor $R_L$. An output matching network may also be required to match the impedance of the output of the amplifier system to an antenna or suitable load impedance, i.e. 50Ω.

To provide improved efficiency across a wide range of input powers, Amplifier 1 and Amplifier 2 are tuned for different power ratings.

Figure 8:
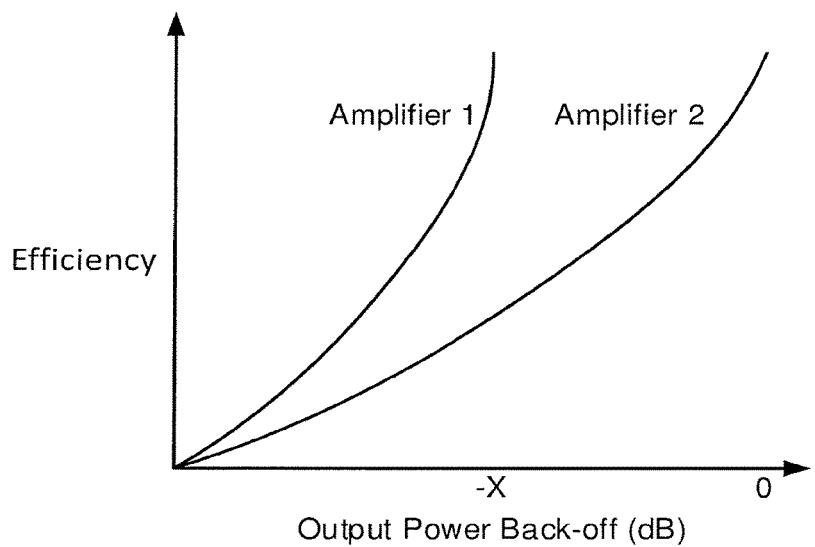
FIG. 8 shows how the efficiency of Amplifier 1 and Amplifier 2 of FIG. 7 varies depending on the amount that the output power is backed-off from the peak output power.

FIG. 8 shows how the efficiency of Amplifier 1 and Amplifier 2 of FIG. 7 varies depending on the amount that the output power is backed-off from the peak output power.

Amplifier 2 has a higher power rating than Amplifier 1. Amplifier 1 reaches a peak output power −X dB (e.g. −8 dB) from the peak output power of Amplifier 2. In the present arrangement, Amplifier 2 has a power rating equal to the peak of the transmitted signal, and Amplifier 1 to approximately the average power, when a signal with a high PAPR is amplified.

Producing two or more class E amplifiers with different output powers can be achieved a number of ways:

1) Different physically sized devices with different power ratings, which will result in different values for $C_1$ and $C_2$.

2) The same device structure with different supply voltages ($V_{DC1}$ and $V_{DC2}$).

3) The same device structure with the same supply voltage, but with differently tuned circuit components.

The arrangement of FIG. 7 is unique compared to the architectures of FIGS. 1-6 in a number of ways:

1) The lack of an output combining network results in a physically smaller design, which lends itself well to complementary metal oxide semiconductor (CMOS) integration for low power applications (e.g. 802.11ax) and reduced volume at high powers (e.g. DVB broadcast transmitter). In contrast, Doherty amplifiers (e.g. FIG. 1) use quarter wavelength transmission lines.

2) Amplifier 1 only operates at low powers (below the peaks). Amplifier 1 can use a physically smaller device than Amplifier 2, thereby reducing cost and size. Having said this, in the arrangement used for FIG. 8, the two amplifiers are the same size, and $P_{OUT}$ is varied by other means.

3) As Amplifiers 1 and 2 operate independently, there is no "load pulling" effect as experienced in the Doherty and outphasing architectures. In the present arrangements, when one amplifier is operating, the other is disabled by applying a negative bias to its gate terminal. This switches the transistor off, so that the disabled amplifier appears simply as a capacitance due its drain-source capacitance ($C_{ds}$). When switched off, the disabled amplifier has little impact on the operation of the active amplifier.

4) The amplifiers of the present arrangements are controlled by biasing voltages applied to the gates of their active devices. Accordingly, the arrangement avoids the need to provide switches on the outputs of the power amplifiers. In contrast, the digitally controlled switching power amplifier of FIG. 5 includes a switch at the output of each amplifier to short the output terminal to ground. The quarter wavelength transformer (λ/4) is required to transform this short to a high impedance at the output terminal to reduce the effect of this switch. Quarter wavelength transformers are large components that would greatly increase the overall size of the system. The present arrangements avoid the need for the quarter wavelength transformers or switches, thereby reducing the size and complexity of the circuit.

The arrangements described herein therefore provide improved efficiency for amplifying signals with a high PAPR but in an implementation that has a reduced complexity and size.

For the results presented herein, an arrangement according to FIG. 7 is assessed, wherein the two power amplifiers have differently tuned components. As mentioned above, with class E operation, performance is largely determined by the device's stray $C_{ds}$. For class E amplifiers, both $C_{ds}$ and output power ($P_{OUT}$) have a dependency on the quality factor (Q) of the band pass filter (BPF).

Figure 9:
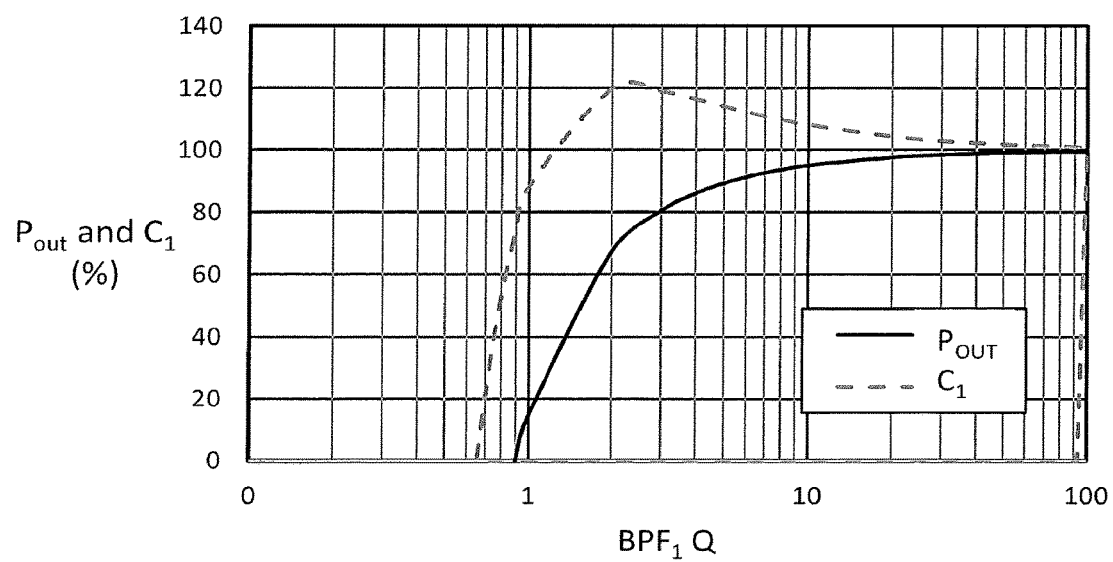
FIG. 9 shows how the output power and drain-source capacitance for a class E power amplifier change as the quality factor Q of the band pass filter is varied.

FIG. 9 shows how the output power and drain-source capacitance for a class E power amplifier change as the quality factor Q of the band-pass filter is varied. It can be seen that for 0.8<Q<10Q has a large effect on $P_{OUT}$, and a lesser one (+/−20%) on $C_1$. Accordingly, the quality factors Q of the band pass filters can be used to tune the performance of the power amplifiers.

Generally with a class E amplifier, Q is assumed to be high. This assumption is held for Amplifier 2. The Q of $BPF_1$ is designed to be low to reduce the power rating of Amplifier 1, relative to Amplifier 2. For example, if the Q of $BPF_1$ is 1 and the Q of $BPF_2$ is 10, the power rating of Amplifier 1 will be 14.5% of Amplifier 2, or −8.4 dB. This arrangement is well suited for signals with a PAPR of around 8 dB, as found in LTE and DVB.

TABLE 1 dual-amplifier PA architectures

| Type | Amp 1 | Amp 2 | Modulate Load? | $PA_1:PA_2$ Power Rating | $PA_1$ Type | $PA_2$ Type | Output Combiner |
|---|---|---|---|---|---|---|---|
| Doherty | Full signal (Carrier) | Peak | Yes | Generally $PA_1 = PA_2$ | Linear (class A or AB) | Non-linear (class B or C) | Quarter wavelength transformer |
| Out-phasing | Full signal | Full signal | Yes | $PA_1 = PA_2$ | Non-linear, switching | Non-linear, switching | Reactive network |
| Sequential | Full signal (Main) | Peak | No | Generally $PA_2 > PA_1$ | Linear | Linear | Hybrid combiner |
| Power control switching | Low transmit power | High transmit power | No | $PA_2 > PA_1$ | Linear | Linear | Switch or transmission line combiner |
| Digitally controlled power switching | Below peaks | Peak | No | $PA_2 > PA_1$ | Switching (class F) | Switching (class F) | Quarter wavelength transformer and switch |
| Digital Doherty | Full signal (Carrier) | Peak | Yes | Generally $PA_1 = PA_2$ | Switching (class D) | Switching (class D) | Quarter wavelength transformer |
| FIG. 7 | Below peaks | Peak | No | $PA_2 > PA_1$ | Switching (class E) | Switching (class E) | None |

The primary structural difference between the present arrangement and the examples of FIGS. 1-6 is how the two amplifiers shown are connected together. In the present arrangement, the outputs of the two amplifiers are connected together directly.

Further differences between the present arrangement and the examples of FIGS. 1-6 are shown in Table 1.

The core operational difference between the present arrangement and the examples of FIGS. 1-6 is in how the two amplifiers interact over the dynamic range of the transmitted signal. This is highlighted in columns 2-4 of Table 1. The operation of Amplifier 1 and Amplifier 2 is switched depending on the amplitude of the voltage or power of the input signal as shown in FIG. 10. In an envelope modulated system, the amplitude of the voltage is the envelope voltage.

FIG. 10 shows how the efficiency of the amplification system of FIG. 7 varies as the output power is backed-off from the peak output power. The input signals D1 and D2 are shown below the plot of efficiency.

The system operates over two operating regions (modes). In the first mode, the output power is low and therefore Amplifier 1 (having a lower power rating) is utilised. Accordingly, $D_1$ is set to high to turn on Amplifier 1 and $D_2$ is set to low to turn off Amplifier 2.

As the output power increases, so does the efficiency of Amplifier 1. Again, the peak output power of Amplifier 1 is reached at a back-off of −X dB from the peak output power of Amplifier 2. In this case, when the peak output power of Amplifier 1 is reached, the system switches into the second mode.

In the second mode, the $D_2$ is set high and $D_1$ is set low. This turns Amplifier 1 off and turns on Amplifier 2. The efficiency drops at this point, as Amplifier 2 is less efficient operating below its peak output power; however, the higher output power of Amplifier 2 allows the power to keep increasing beyond the peak output power of Amplifier 1. As the power increases, the efficiency increases up to a maximum at the peak output power of Amplifier 2.

The coarse transition between the two operating regions is likely to introduce distortion. One solution to this is to introduce some hysteresis to the switching. In this case, the threshold at which the switching occurs when the power is increasing is higher than the threshold at which the switching occurs when the power is decreasing.

Alternatively, the transition between Amplifier 1 and Amplifier 2 operation could be gradual, as shown in FIG. 11.

FIG. 11 shows how the efficiency varies in an arrangement with gradual switching. The operation and is much like that of FIG. 11; however, when the peak output power for Amplifier 1 is reached, the system is switched smoothly between Amplifier 1 and Amplifier 2. To achieve this, $D_1$ is transitioned gradually from high to low over a transition region. At the same time, $D_2$ is transitioned gradually from low to high. This arrangement increases linearity at the cost of reduced efficiency overall.

By only operating one PA at a time, the arrangements do not exploit "load modulation" like the Doherty and outphasing amplifiers. In Doherty and outphasing, the interaction between the two PAs is purposely exploited to increase efficiency.

Further distinguishing features can be found in Table 1. It can be seen that, generally, outphasing power amplifiers use two equal power rated amplifiers. The use of two different power rated amplifiers in the present arrangement ensures that the two amplifiers can alternatively amplify different parts of the transmitted signal's dynamic range.

In the outphasing power amplifier, both amplifiers operate all the time, whereas in the Doherty power amplifier, sequential power amplifier, and in the arrangements described herein, only one amplifier operates at low output power, with both amplifiers operating at high output powers. This is detailed in Table 1.

The switching of the present arrangement differs from that of FIG. 4, which switches between different amplifiers for power control purposes. The switching in FIG. 4 occurs at the power control rate (in the order of seconds). In contrast, the present arrangement switches dynamically at the signal bandwidth.

The arrangements described herein relate to a low complexity technique for improving power amplifier efficiency. This technique involves two amplifiers (e.g. class E amplifiers) connected together at their outputs. The two amplifiers are optimised for high efficiency at different output powers ($P_{OUT}$). For example, at the peak transmit power, and at 8 dB back-off, to match the signal PAPR. In this arrangement, the two different output powers are scaled by circuit design, but other types are available i.e. a different supply voltage for the amplifiers.

This technique is scalable in $P_{OUT}$ and operating frequency, making it suitable for a wide range of applications. Provided suitable active devices (transistors) are available, it could be applied to high power broadcast applications, as well as low power devices.

The arrangements described herein provide high efficiency at low complexity. The goal of any efficiency enhancing mechanism is to improve performance with the smallest overhead.

Figure 12:
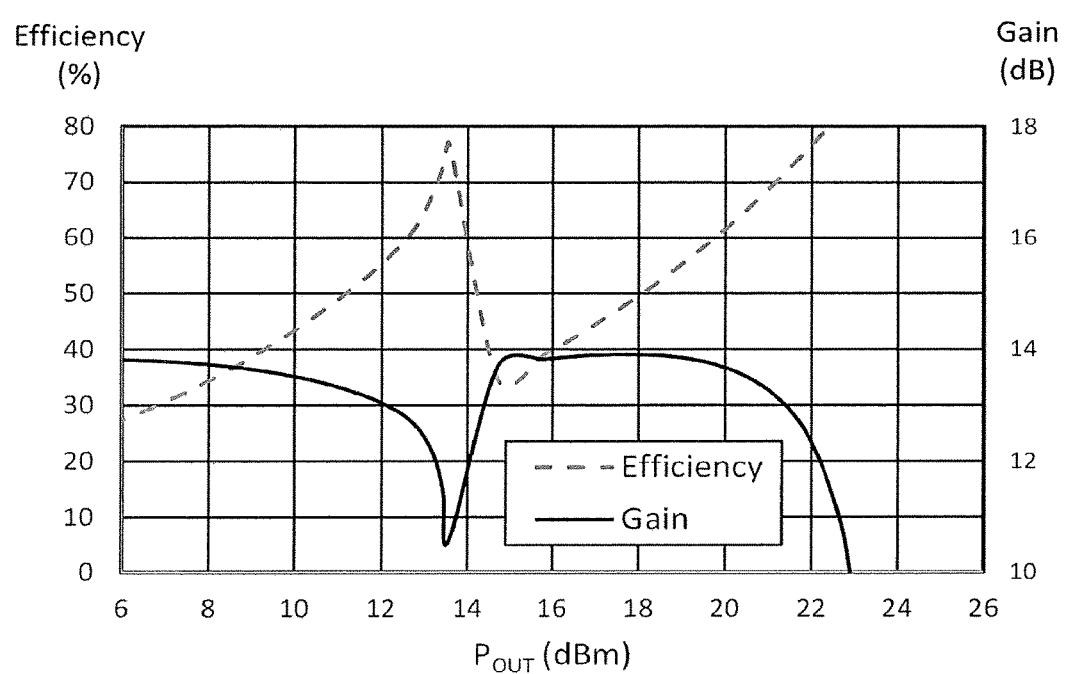
FIG. 12 shows how efficiency and gain vary depending on $P_{OUT}$ in a simulated system according to FIG. 7 with switching at 13.5 dBm.

FIG. 12 shows how efficiency and gain vary depending on $P_{OUT}$ in a simulated system according to FIG. 7 with switching at 13.5 dBm. The efficiency response is similar to that of FIG. 10. The gain is relatively stable across a wide $P_{OUT}$ range, with the gain dropping close to the power at which the active amplifiers are switched.

The results of FIG. 12 were obtained by simulating an amplifier that was optimised for 900 MHz using two small GaAs FET devices. Amplifier 2 was optimised for a $P_{OUT}$ of 22 dBm, with a $BPF_2$ Q of 10. Amplifier 1 was optimised for 13.5 dBm (8.5 dB back-off) with a $BPF_1$ Q of 1.

The efficiency and gain profiles against $P_{OUT}$ are shown in FIG. 12 where the switch over point is defined as the 3 dB compression point of Amplifier 1 ($P_{3\ dB}$, i.e. where the gain has dropped by 3 dB due to overdriving). This is clearly shown in the gain curve, which dips as the amplifiers switch over. The switching point could be set at a lower value of gain compression, but that would reduce the average efficiency. The switching point could be set to a gain value between 1 dB and 5 dB.

Determining the optimum switching point depends on what degree of distortion is acceptable. For example, if the emission mask is desired to be met without the assistance of any external digital pre-distortion. The results suggest an efficiency of >60% for a signal with a PAPR of 8 dB, which is a significant for such a simple design.

The results of FIG. 12 prove that the present arrangement is capable of achieving high efficiency over a wide $P_{OUT}$ dynamic range with a single RF input and only the added complexity of two digital control signals, D1 and D2.

In the above description, the output power back-off, or instantaneous power, is discussed. This relates to of amplitude of the voltage of the signal at that time. In an envelope modulated signal, the amplitude of the voltage (the envelope voltage) varies over time. The above arrangements are configured to switch between the power amplifiers at a rate that is equal to or faster than the envelope frequency.

Where two switching amplifiers are used, the arrangements switch around the average envelope voltage (midway between peak and trough). The switching therefore occurs at twice the envelope frequency.

The arrangements described herein, however, are not limited to dual-amplifier implementations. More than two switching amplifiers may be used, each configured to be efficient for different ranges of input voltages. For instance, where three switching amplifiers are used, a first may be activated around the trough of the envelope, a second may be activated around the mid-point of the envelope, and a third may be activated around the peaks of the envelope.

To implement this switching, threshold envelope voltages are used to define voltage regions within which each switching amplifier is activated. As discussed above, hysteresis may be added, so the threshold for turning off a specific switching amplifier may be higher than the threshold for turning the amplifier on. This can help to increase the linearity of the system, although this comes at the expense of overall efficiency.

Whilst the arrangement of FIG. 7 provides amplification via n-channel field effect transistors (FETs), alternative types of active devices, and alternative types of doping, may be used. For instance, a p-channel FET (or an n or p-doped bipolar junction transistor) could be used, where the output is connected to the drain of the FET (the collector of the nor p-doped bipolar junction transistor).

Whilst the arrangement of FIG. 7 utilises band pass filters, low pass filters may also be used to filter out higher harmonics from the output of each power amplifier.

While certain arrangements have been described, the arrangements have been presented by way of example only, and are not intended to limit the scope of the inventions. Indeed, the novel methods and devices described herein may be embodied in a variety of other forms; furthermore, various omissions, substitutions and changes in the form of the methods and systems described herein may be made.

The invention claimed is:

1. An amplifier for amplifying radio frequency signals, the amplifier comprising:
   an input node for receiving an input radio frequency signal to be amplified;
   a signal splitter connected to the input node and configured to split the input radio frequency signal into two or more signals;
   two or more switching power amplifiers corresponding to the two or more signals, wherein each of the switching power amplifiers is configured to amplify a respective signal of the two or more signals using an active device and output a respective amplified signal at a respective output terminal of the switching power amplifier when the switching power amplifier is activated, wherein each of the two or more switching power amplifiers has a different maximum output power;
   an output node connected to each of the output terminals of the switching power amplifiers to combine the amplified signals and output a combined amplified signal, and
   control circuitry configured to issue two or more control signals to the two or more switching power amplifiers, each control signal controlling a bias voltage provided to a gate of the active device of the respective switching power amplifier to selectively activate and deactivate the active device, wherein
   the maximum output power of a first amplifier of the switching power amplifiers is lower than the maximum output power of a second amplifier of the switching power amplifiers; and
   the control circuitry is configured to activate the first switching power amplifier when the input signal has an amplitude that falls within a first region and to activate the second switching power amplifier when the amplitude of the input radio frequency signal falls within a second region, the second region being higher than the first region.

2. The amplifier of claim 1 wherein the amplifier is configured to, for each switching power amplifier, combine the respective bias voltage with the respective signal to form a respective combined bias voltage and apply the respective combined bias voltage to the gate of the respective active device to amplify the respective signal.

3. The amplifier of claim 1 wherein the two or more switching power amplifiers are class E power amplifiers.

4. The amplifier of claim 1 wherein the maximum output power of the first switching power amplifier is substantially equal to an average power of the input radio frequency signal.

5. The amplifier of claim 1 wherein the control circuitry is configured to activate the second switching power amplifier when the amplitude of the input radio frequency signal passes above a first threshold and to activate the first switching power amplifier when the amplitude of the input radio frequency signal passes below a second threshold.

6. The amplifier of claim 5 wherein the first and second thresholds are the same.

7. The amplifier of claim 5 wherein the second threshold is lower than the first threshold.

8. The amplifier of claim 5 wherein the control circuitry is configured to deactivate the first switching power amplifier when the amplitude of the input radio frequency signal passes above the first threshold and to deactivate the second switching power amplifier when the power of the input radio frequency signal passes below the second threshold.

9. The amplifier of claim 5 wherein the control circuitry is configured to gradually transition between switching power amplifiers when switching between switching power amplifiers.

10. The amplifier of claim 9 wherein gradually transitioning between switching power amplifiers comprises, when switching between from the first switching power amplifier to the second switching power amplifier:
    gradually changing the bias voltage for the first switching power amplifier from a respective activation bias level to a respective deactivation bias level over a range of amplitudes for the input radio frequency signal; and
    gradually changing the bias voltage for the second switching power amplifier from a respective deactivation bias level to a respective activation bias level over the range of amplitudes for the input radio frequency signal.

11. The amplifier of claim 9 wherein gradually transitioning between switching power amplifiers comprises, when switching between from the second switching power amplifier to the first switching power amplifier:
    gradually changing the bias voltage for the second switching power amplifier from a respective activation bias level to a respective deactivation bias level over a range of amplitudes for the input radio frequency signal; and
    gradually changing the bias voltage for the first switching power amplifier from a respective deactivation bias level to a respective activation bias level over the range of amplitudes for the input radio frequency signal.

12. The amplifier of claim 9 wherein gradually transitioning between switching power amplifiers comprises changing the respective bias voltages for the respective switching power amplifiers based on respective predefined changes per unit change in the amplitude of the input radio frequency signal.

13. A communication device comprising:
- an amplifier according to claim 1;
- a processor configured to generate the input radio frequency signal and provide the input radio frequency signal to the amplifier; and
- an antenna configured to receive the combined amplified signal from the amplifier and transmit the combined amplified signal.

* * * * *